(12) United States Patent
Jiang et al.

(10) Patent No.: US 8,645,310 B2
(45) Date of Patent: Feb. 4, 2014

(54) EFFICIENT SOURCE OF INFEASIBILITY IDENTIFICATION IN TIMED AUTOMATA TRACES

(75) Inventors: Shengbing Jiang, Rochester Hills, MI (US); Aleksey Nogin, Fresno, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 331 days.

(21) Appl. No.: 13/053,739

(22) Filed: Mar. 22, 2011

(65) Prior Publication Data

US 2012/0246108 A1    Sep. 27, 2012

(51) Int. Cl.
*G06F 17/00*    (2006.01)
*G06N 7/00*    (2006.01)
*G06N 7/08*    (2006.01)

(52) U.S. Cl.
USPC .......................................................... 706/58

(58) Field of Classification Search
USPC .......................................................... 706/58
See application file for complete search history.

(56) References Cited

U.S. PATENT DOCUMENTS

2007/0271204 A1    11/2007    Jiang

OTHER PUBLICATIONS

Counterexamples Revisited:Principles, Algorithms, Applications Edmund Clarke1 and Helmut Veith2.*
Advances in counterexample-guided abstraction refinement E. M. Clarke Carnegie Mellon University Ofer Strichman.*
Locating Minimal Infeasible Constraint Sets in Linear Programs John W. Chinneck Systems and Computer Engineering, Carleton University, Ottawa, Ontario KIS 5B6, Canada, Email: ehinneek@see.earleton.ea Erik W. Dravnieks Systems and Computer Engineering, Carleton University, Ottawa, Ontario KIS 5B6, Canada.*
Distributed LTL Model Checking Based on Negative Cycle Detection Luboš Brim, Ivana Černá, Pavel Krčál, and Radek Pelánek Department of Computer Science, Faculty of Informatics Masaryk University Brno, Czech Republic.*
Modelling and Verication of Real-Time Systems Using Timed Automata: Theory and Practice Paul Pettersson.*
Optimal reachability for multi-priced timed automata Kim Guldstrand Larsen* , Jacob Ilium Rasmussen Aalborg University, Denmark.*
A Boolean approach to unbounded, fully symbolic model checking of timed automata Sanjit A. Seshia, Carnegie Mellon University Randal Bryant.*
Counterexamples Revisited:Principles, Algorithms, Applications Edmund Clarke1 and Helmut Veith2 N. Dershowitz (Ed.): Verification (Manna Festschrift), LNCS 2772, pp. 208-224, 2003. Springer-Verlag Berlin Heidelberg 2003.*
Advances in counterexample-guided abstraction refinement E. M. Clarke Carnegie Mellon University Ofer Strichman Jan. 1, 2003.*

(Continued)

*Primary Examiner* — Kakali Chaki
*Assistant Examiner* — Ababacar Seck
(74) *Attorney, Agent, or Firm* — John A. Miller; Miller IP Group, PLC

(57) ABSTRACT

A method for verifying the performance of a real-time system modeled as a timed automaton. An abstract model of the system is checked against an initial Linear Temporal Logic specification. If a path to an undesirable state is found, the counterexample is validated or invalidated using negative cycle detection. If a negative cycle is detected, optimization is undertaken to identify a minimal infeasible fragment in the negative cycle. The specification is then refined to eliminate usage of the minimal infeasible fragment, and the abstract model is then checked against the refined specification.

17 Claims, 2 Drawing Sheets

(56) References Cited

OTHER PUBLICATIONS

Locating Minimal Infeasible Constraint Sets in Linear Programs John W. Chinneck Erik W. Dravnieks (Received. Dec. 1989; final revision received Oct. 1990, accepted Dec. 1990).*

Distributed LTL Model Checking Based on Negative Cycle Detection Luboš Brim, Ivana Černá, Pavel Krčál, and Radek Pelánek Department of Computer Science, Faculty of Informatics Masaryk University Brno, Czech Republic—Springer-Verlag Berlin Heidelberg 2001.*

Diagnosis of Repeated Failures for Discrete EventSystems With Linear-Time Temporal Logic Specications Shengbing Jiang (shengbing.jiang@gm.com) GM R&D and Planning, Warren, MI 48090-9055 Ratnesh Kumar (rkumar@iastate.edu) Dept. of Elec. & Comp. Eng., Iowa State Univ., Ames, IA 50014.*

Modelling and Verication of Real-Time Systems Using Timed Automata: Theory and Practice Paul Pettersson A Dissertation submitted for the Degree of Doctor of Philosophy Department of Computer Systems Uppsala University Feb. 1999.*

Optimal reachability for multi-priced timed automata Kim Guldstrand Larsen, Jacob Ilium Rasmussen Aalborg University, Denmark ACM SIGMETRICS Performance Evaluation Review Homepage archive vol. 32 Issue 4, Mar. 2005 pp. 34-40.*

A Boolean approach to unbounded, fully symbolic model checking of timed automata Sanjit A. Seshia Carnegie Mellon University Randal Bryant Jan. 1, 2003.*

Optimal scheduling using priced timed automata , 2005 Gerd Behrmann, Kim G. Larsen, Jacob I. Rasmussen Aalborg University, Denmark http://dl.acm.org/citation.cfm?id=1059823.*

Schmalz, Matthias, "Counterexamples in Probabilistic LTL Model Checking for Markov Chains" Paper, pp. 1-15, Switzerland.

Doyen, Laurent "Alogirthmic Analysis of Complex Semantics for Timed and Hybrid Automata" Thesis written in Jun. 2006. 204 pgs.

Barnat, J. "From Distributed Memory Cycle Detection to Parallel LTL Model Checking" Elsevier (Electronic Note in Theoretical Computer Science 133, (2005) pp. 21-39.

* cited by examiner

EFFICIENT SOURCE OF INFEASIBILITY IDENTIFICATION IN TIMED AUTOMATA TRACES

BACKGROUND OF THE INVENTION

1. Field of the Invention

This invention relates generally to verification of control system properties and, more particularly, to a method for infeasibility identification in timed automata which checks an abstract model of a real-time system against a Linear Temporal Logic specification and, if a counterexample is found, validates or invalidates the counterexample using negative cycle detection, identifies a minimal infeasible trace fragment, and refines the specification.

2. Discussion of the Related Art

Modern vehicles employ many types of embedded control systems, to improve the performance, comfort, and safety of the vehicles. Such control systems include engine controls, suspension controls, and steering controls, among many others. Real time systems are important for their use in verification of embedded automotive control systems, and control systems in other applications such as aircraft. Formal verification of a control system is proof that the system satisfies a given property under every possible condition. If verification is not possible, then a counterexample is provided—that is, a trajectory in which the given property fails.

Some existing verification approaches compute all reachable states until a fixed point is reached, or an undesirable state is reached. Other verification approaches work backwards from an undesirable state to find all states that could lead to it. These approaches do not scale well to large problem sizes, due to the exhaustive nature of the reachable state computation. This is because the computer memory required to run a formal verification grows exponentially with the number of variables in the control system state space. For the complex control systems which are typical of automotive applications, the number of variables involved makes traditional exhaustive verification approaches untenable, both in terms of computation time and memory space requirements.

Another verification approach has been proposed, where counterexample fragments are used to guide specification refinement for linear hybrid automata (LHA). However, there is an opportunity to make this approach more efficient for control systems modeled as timed automata (TA), which are a subset of LHA.

SUMMARY OF THE INVENTION

In accordance with the teachings of the present invention, a method is disclosed for verifying the performance of a real-time system modeled as a timed automaton. An abstract model of the system is checked against an initial Linear Temporal Logic specification. If a path to an undesirable state is found, the counterexample is validated or invalidated using negative cycle detection. If a negative cycle is detected, optimization is undertaken to identify a minimal infeasible fragment in the negative cycle. The specification is then refined to eliminate usage of the minimal infeasible fragment, and the abstract model is then checked against the refined specification.

Additional features of the present invention will become apparent from the following description and appended claims, taken in conjunction with the accompanying drawings.

DETAILED DESCRIPTION OF THE EMBODIMENTS

The following discussion of the embodiments of the invention directed to efficient infeasibility identification in timed automata traces is merely exemplary in nature, and is in no way intended to limit the invention or its applications or uses.

The formal verification of timing properties of critical embedded automotive control systems is very important. Such verification is done via computer-based analysis. There are a number of existing verification methods, but the biggest issue in all of the existing approaches is scalability, both in terms of computer memory usage and runtime. One method, providing a novel, highly efficient algorithm for verifying linear hybrid automata, is described in U.S. Patent Application Publication No. 2007/0271204 (Ser. No. 11/749,768), titled VERIFICATION OF LINEAR HYBRID AUTOMATON, filed May 17, 2007, which is assigned to the assignee of this application and hereby incorporated by reference. One of the most performance-critical steps in the algorithm is identification of the infeasible fragments in infeasible traces—that is, finding out which parts of an infeasible trace make that trace infeasible.

The present invention provides an efficient method of finding small infeasible fragments in traces of timed automata (TA), which are a subclass of linear hybrid automata (LHA). Finding a minimal infeasible fragment is one critical step in the formal verification of linear hybrid automata by counterexample fragment-based refinement. Such an efficiency improvement can dramatically increase the scalability of timed automata verification.

A timed automaton is a mathematical concept used for modeling and verification of real-time systems. The timed automaton model is a labeled transition system model for components in real-time systems. A timed automaton has time-passage actions, in addition to ordinary input, output and internal actions. The nonnegative real numbers are used as the time domain. Timed automata form "trajectories", which describe the evolution of the system state during time-passage. The behavior of a timed automaton is describable in terms of timed traces, or alternatively in terms of admissible timed traces.

Each timed automaton has a finite set of clocks, all running at the same rate, and a finite set of locations, or modes of operation. Transitions between some locations are possible. Each automaton location or transition may have clock restrictions in the form of inequalities. Transitions may also reset specific clocks to zero. A synchronization rule may restrict transitions of a component, based on the state of other components, such as the locations of other components at the time, or simultaneous transitions of other components. In a collection of several automata components, all components of the collection run in parallel.

Figure 1:
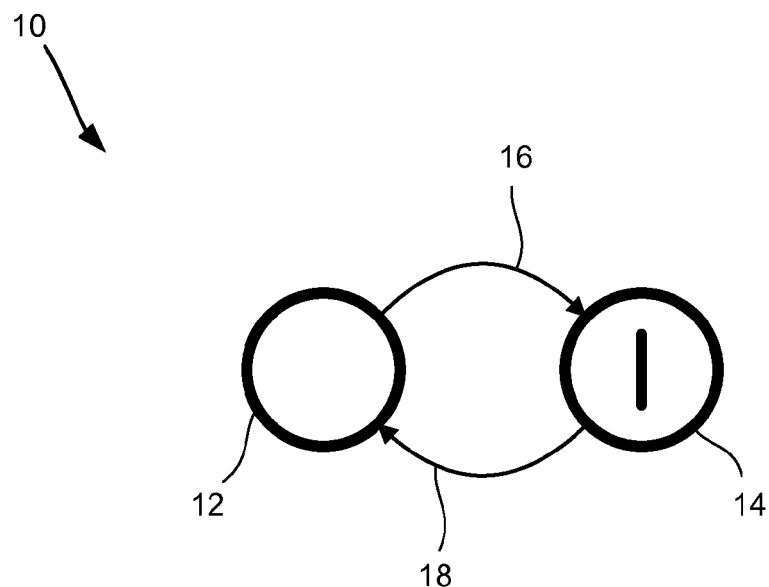
FIG. 1 is a state transition diagram of a simple timed automaton.

FIG. 1 is a state transition diagram showing an example of a simple timed automaton 10. The timed automaton 10 has a single component with two locations—an Off location 12, and an On location 14. The timed automaton 10 also has two transitions—a Start transition 16, and a Stop transition 18. The Start transition 16 takes the timed automaton 10 from the Off location 12 to the On location 14, while the Stop transition 18 takes the timed automaton 10 from the On location 14 to the Off location 12. There is one clock, X, used in the timed automaton 10. The clock X measures time in seconds. The following restrictions are defined for the timed automaton 10:

The clock X is set to 0 at the Start transition 16 (Start: X=0).
The clock X must be greater than or equal to 1 at the Stop transition 18 (Stop: X≥1).
The clock X must be less than or equal to 2 at the On location 14 (On: X≤2).

As a result of the restrictions defined above, it can be observed that, after a start, the timed automaton 10 will stay on for at least 1 second, and it will stop within 2 seconds. Although very simple in nature, the timed automaton 10 illustrates the concepts of locations, transitions, and restrictions. Specific trajectories of the timed automaton 10 can thus be modeled as a system of difference inequalities, and behavior can be evaluated with a verification algorithm.

The goal of the verification algorithm is to answer the question, "Can an 'undesirable state' be reached in a given automaton?" If the answer is yes, then an example path to the undesirable state is produced. Examples of undesirable states include; state variable X exceeds state variable Y; two components reach a certain location (such as On) at the same time; or a certain event happens but another related event does not happen subsequently. Before a real-time system can reliably be used in a commercial product, verification that these undesirable states cannot be reached is required. The present invention provides a verification algorithm for timed automata which is far more efficient than previous approaches.

The general concept of the verification algorithm can be described in an outline as follows:

The algorithm presupposes an existing Linear Temporal Logic (LTL) model checker, which is a tool that can analyze paths in regular automata without clocks. LTL is a mathematical language for describing execution paths, or trajectories. One example of such an LTL model checker which is well known in the art is NuSMV.
Use the LTL model checker to find paths to undesirable states while ignoring clock restrictions.
If a clock-less path to an undesirable state is found, try filling in the missing timing data.
If a fragment of the clock-less path is infeasible with clocks, refine the question asked of the LTL model checker;
"Can an undesirable state be reached without following any of the infeasible fragments?"
If so, repeat the step of filling in the missing timing data.

Figure 2:
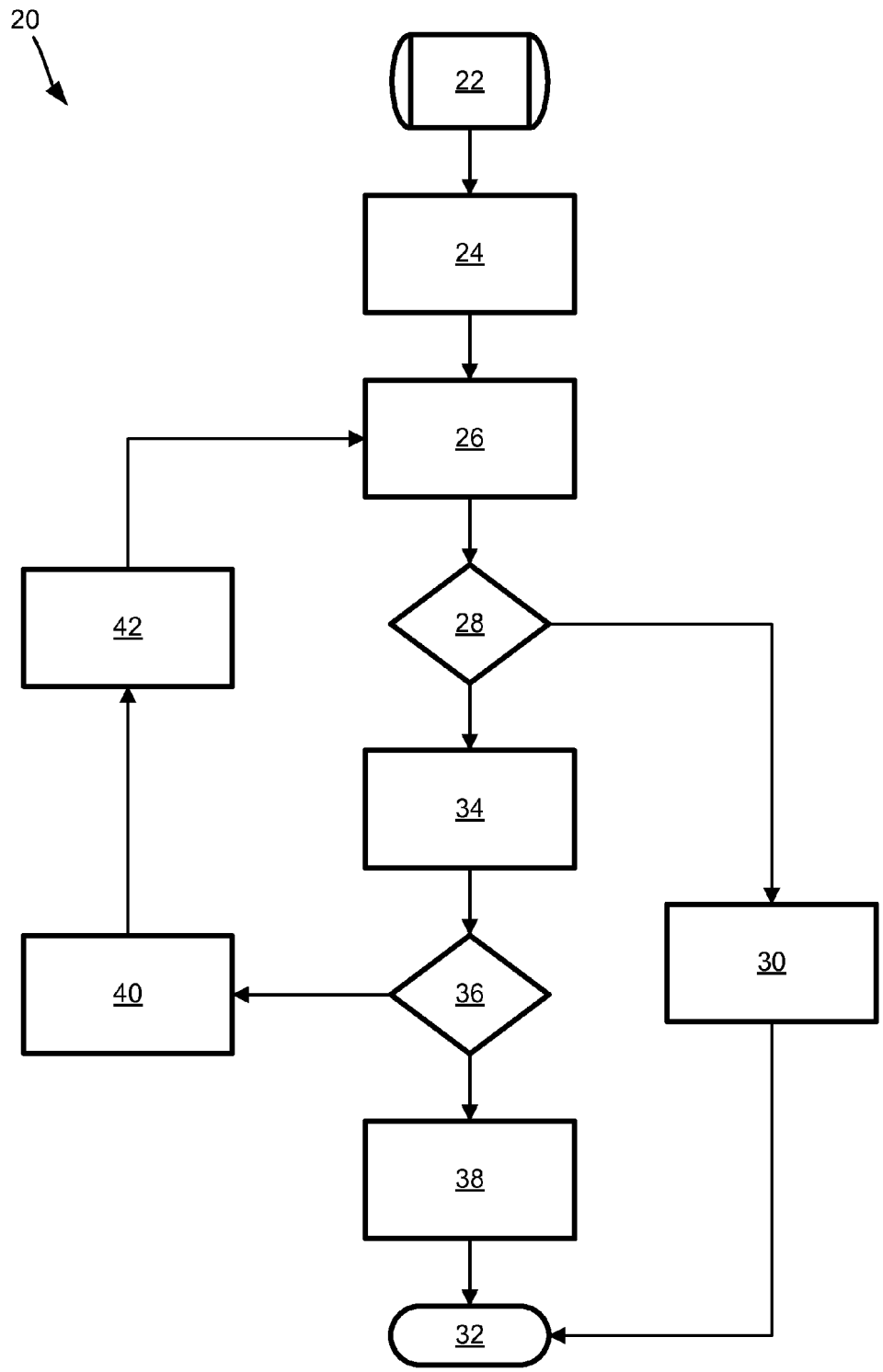
FIG. 2 is a process flow diagram of a method for performance verification of a real-time system using negative cycle detection and infeasible fragment identification in timed automata.

FIG. 2 is a flow chart diagram 20 of a method for performance verification of a real-time system using negative cycle detection and infeasible fragment identification in timed automata, as implemented in the algorithm outlined above. Beginning from start element 22, the process moves to box 24, where an abstract model and initial LTL specification are generated. The abstract model ignores continuous properties of the system, and considers only the system's discrete state properties. The LTL specification describes the performance property of the system that is to be verified. Other forms of temporal logic specification may be used instead of LTL.

At box 26, the abstract model is checked against the specification. At decision diamond 28, if the abstract model satisfies the specification—that is, no path to an undesirable state is found—then the process branches to box 30, where an output of "OK" is produced, and the process ends at terminus 32. At the decision diamond 28, if the abstract model does not satisfy the specification, then the process continues at box 34, where the counterexample (path to an undesirable state) is validated or invalidated using negative cycle detection. This is done by adding the continuous trajectory information back into the abstract model. When checking the feasibility of a system of difference inequalities, if the system is infeasible, a negative cycle detection algorithm will return a negative cycle that consists of a set of contradictory inequalities, from which the corresponding infeasible fragment can be identified.

At decision diamond 36, a determination is made whether the counterexample is valid. If the counterexample is validated at the box 34, then the process continues from the decision diamond 36 to box 38, an output of "Not OK" is produced, meaning that the undesirable state really can be reached, the counterexample path is output, and the process ends at the terminus 32. If the counterexample is not validated at the box 34—that is, a negative cycle is detected in the counterexample—then from the decision diamond 36 the process branches to box 40, where an infeasible fragment is identified, and optimization is used to derive the minimal infeasible fragment. At box 42, the LTL specification is refined to exclude the minimal infeasible fragment, and the abstract model is checked against the refined LTL specification at the box 26. The process then repeats from the box 26 onward, until the terminus 32 is reached, either with an "OK" output or a "Not OK" output.

The idea behind the specification refinement at the box 42 is that not every trace in the abstract model is feasible; therefore, the specification can be refined so that only the traces in the abstract model which do not include the infeasible fragment need to be checked. By repeatedly identifying infeasible fragments and removing them from the specification, it is possible to validate the behavior of a timed automaton without encountering the state explosion problem which makes other real-time system verification computational methods unworkable.

It is important to identify the smallest infeasible fragment in an infeasible trace. Suppose, for example, that the following counterexample (path to an undesirable state) is found in a timed automaton:

Initial→ ... → ... →R→X→Y→Z→ ... → ... → U.S.

Where "Initial" is the initial location or state of a component, "U.S." is the undesirable state, and other intermediate states are shown in between.

In this example, suppose that "X→Y→Z" is in fact infeasible. Thus, the question that should be asked in the specification refinement at the box 42 is, "Can an undesirable state be reached without using the X→Y→Z path?" Of course, if the X→Y→Z path is infeasible, then any path containing X→Y→Z as a sub-path is also infeasible. For example, R→X→Y→Z would be infeasible. Suppose then that the suboptimal path R→X→Y→Z is identified as the infeasible fragment for specification refinement, rather than the minimal X→Y→Z fragment. If the specification is refined to preclude usage of the path R→X→Y→Z, and the abstract model is checked against the refined specification, then the model checker could still return a counterexample containing fragments which it believes to be valid, such as "S→X→Y→Z" or "T→X→Y→Z". Yet both S→X→Y→Z and T→X→Y→Z would subsequently be found to be infeasible, because in fact the sub-path X→Y→Z is infeasible. This illustrates the importance of identifying the minimal infeasible fragment, thus avoiding multiple iterations caused by using a suboptimal infeasible fragment for specification refinement.

Identification of the smallest infeasible fragment requires consideration of each of the components in the automata, because the definition of the "undesirable state" may involve the location of more than one component, such as "components 1 and 2 both in location X". Another example can be used to illustrate this concept. Consider an automaton with four components, and which reaches an undesirable state via the following paths:

Component 0: $0 - 0 \to 1 \to 3 \to 2 - 2$

Component 1: $I \to R \to C - C \to I - I$

Component 2: $I - I \to R - R \to C \to A$

Component 3: $I - I \to R \to C \to A - A$

Where the numbers 0-3 and letters I/R/C/A represent locations or states of the components in the automaton, the "-" character represents a time step with no change of location or state (also known as an $\epsilon$-transition—the component remains in the same location or state), and the "$\to$" character represents a transition with a change of location or state.

In this example, the undesirable state is Component 2 and Component 3 both being in the A state simultaneously, as seen at the end of the traces. After analysis, it is determined that it is infeasible for Component 2 to follow a trace from R-R→C while Component 3 moves from R→C→A. Thus, the minimal infeasible fragment is:

Component 2: $R - R \to C$

Component 3: $R \to C \to A$

Including any other components (increasing the breadth of the fragment) or any other transitions (increasing the length of the fragment) would result in a suboptimal infeasible fragment, leading to the inefficiencies described previously. This example illustrates the need to consider all components in the infeasibility identification, and further illustrates the need to optimize to the minimal infeasible fragment.

Optimization can be performed to reduce an infeasible fragment to a minimal length and breadth in timed automata. Optimization involves the following steps:
  Label each inequality to indicate involved components and transitions in the original timed automaton model.
  Perform optimizations for different situations and modify the labels accordingly to achieve a minimal length infeasible fragment.
  Derive the minimal infeasible fragment from the modified labels.

The following example illustrates the above steps. A single-component timed automaton follows the trace:

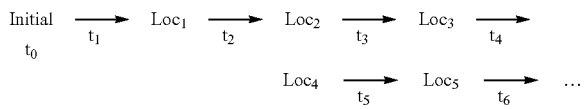

Where Initial is the initial state or location of the component, $Loc_1$-$Loc_5$ are the subsequent locations, and $t_0$-$t_6$ are the transition time variables. The following inequalities can be written for this timed automaton:

$$t_1 - t_0 \geq 0$$

$$t_2 - t_1 \geq 0$$

$$t_3 - t_1 \geq 0 \tag{1}$$

Other inequalities, similar to those of Inequality Set (1), can also be written by inspection, given that time increases continuously.

Consider then that two clocks, $C_1$ and $C_2$, are defined for the timed automaton described above, with the clock restrictions and transition clock resets defined as shown below:

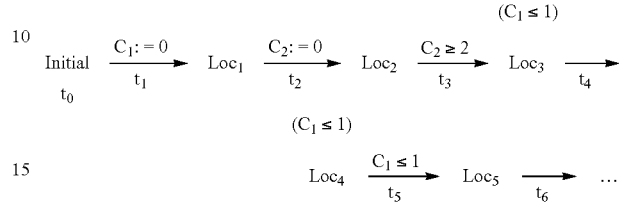

Where the clock restrictions shown in parentheses are associated with a location ($Loc_3$ and $Loc_4$), and the clock restrictions and resets not in parentheses are associated with a transition ($t_1$, $t_2$, $t_3$, and $t_5$).

The clock restrictions yield the following inequalities, which can be evaluated along with those shown in Inequality Set (1):

$$t_3 - t_2 \geq 2$$

$$t_5 - t_1 \leq 1 \tag{2}$$

The system of difference inequalities is then written such that all are expressed as "less than" inequalities, as follows:

$$t_1 - t_2 \leq 0$$

$$t_2 - t_3 \leq -2$$

$$t_3 - t_4 \leq 0$$

$$t_4 - t_5 \leq 0$$

$$t_5 - t_1 \leq 1 \tag{3}$$

Figure 3:
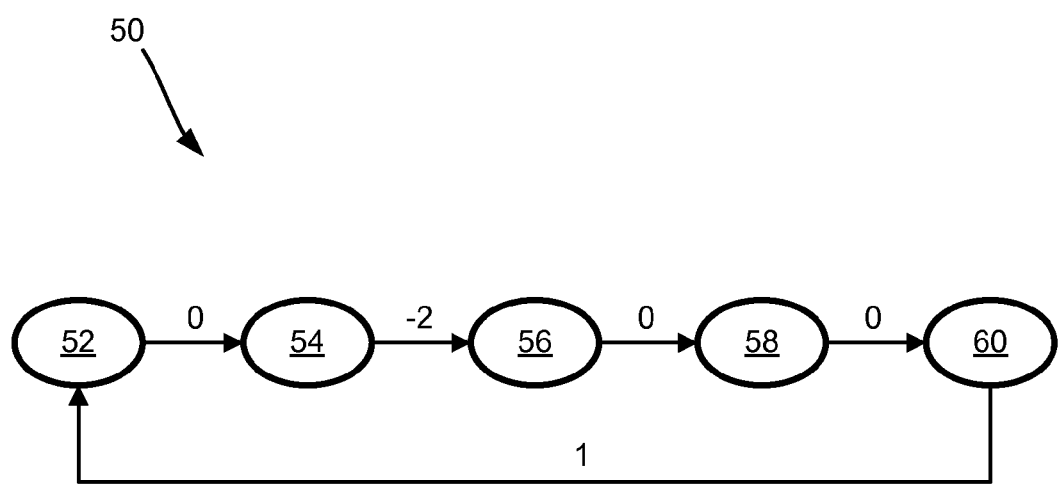
FIG. 3 is a graphical illustration of a negative cycle which is derived from a system of difference inequalities.

FIG. 3 is a graphical illustration of a negative cycle 50 which is derived from the system of difference inequalities expressed in Inequality Set (3). Element 52 represents transition time $t_1$, element 54 represents transition time $t_2$, element 56 represents transition time $t_3$, element 58 represents transition time $t_4$, and element 60 represents transition time $t_5$. The numeric values shown along the arrows are the time values on the right-hand side of the inequalities in Inequality Set (3). This is a negative cycle because the set of inequalities form a complete cycle, and the sum of the numeric values is negative (0−2+0+0+1=−1).

Now that the negative cycle 50 has been detected, optimization is used to identify a minimal infeasible fragment. This begins by replacing $t_5 - t_1 \leq 1$ and $t_1 - t_2 \leq 0$ with $t_5 - t_2 \leq -1$. This replacement eliminates $t_1$ from the infeasible fragment, and can be made because the clock $C_1$ is not reset from $t_2$ to $t_4$. Further optimization would replace $t_5 - t_2 \leq 1$, $t_3 - t_4 \leq 0$, and $t_4 - t_5 \leq 0$ with $t_3 - t_2 \leq 1$, from the fact that $C_1 \leq 1$ is an invariant constraint for $Loc_3$ and $Loc_4$. After these optimizations, a minimal length infeasible fragment from $Loc_1$ to $Loc_3$ would remain, instead of the original infeasible trace from Initial to $Loc_5$.

The above discussion clearly describes the concept of validating real-time system performance by way of negative cycle detection and infeasible trace identification, and the need for optimization to identify the minimal infeasible fragment. Now the discussion will turn to a detailed description of how these things are done.

Negative cycle detection, as performed at the box 34, is a process that, given a directed graph with edges labeled by rational numbers, finds whether there is a cycle in the graph such that the sum of all labels of the cycle's edges is negative and if so finds one such cycle. The directed graph represents the counterexample identified at the box 26.

In a preferred embodiment of the present invention, a negative cycle detection algorithm is used that provides at least the following functionality:

The algorithm takes as input a directed graph, presented as a set of edges. Each edge is annotated with its weight ("distance") and an optional label.

When the input graph contains one or more cycles with negative total weight, the algorithm finds one of such cycles and returns the list of labels of all the edges from that cycle. The algorithm is guaranteed to find a non-self-intersecting cycle, but otherwise no assumptions are made on which cycle can be returned—so any algorithm used is free to return any of the non-self-intersecting negative cycles present in the input.

If there are no negative cycles in the input graph, the algorithm returns a feasible assignment of values for each graph vertex, such that for each edge the difference between the value assigned to the edge tail and head is less than or equal to the edge's weight.

There are a number of well-understood algorithms known in the art that have the above properties.

The feasibility verification step, previously described and shown on the flow chart diagram 20, in the case of timed automata can be naturally expressed as a feasibility check for a system of difference inequalities. It is well known in the art how to map the feasibility checking of a system of inequalities of the form $v_i - v_j \leq c$ to a negative cycle detection problem—by translating every such inequality into an edge from $v_i$ to $v_j$ with weight c.

However, in the present case, attention must also be paid to systems of inequalities containing strict inequalities of the form $v_i - v_j < c$, and single-variable inequalities of the form $v_i \circ c$ where $\circ$ could be any of $<, \leq, >,$ or $\geq$ and $c \in \mathbb{Q}$ ($\mathbb{Q}$ is the set of rational numbers). In order to reduce such systems of inequalities to a negative cycle detection problem, they can be rewritten as follows:

Introduce a fresh variable $v_0 := 0$ and rewrite $v_i \circ c$ as $v_i - v_0 \circ c$. Note that any solution S for the rewritten problem can be translated back to a solution S' of the original problem by calculating $S'(v_i) := S(v_i) - S(v_0)$.

Rewrite strict inequalities $v_i - v_j < c$ as $v_i - v_j \leq c - \epsilon$, where the value $\epsilon$ is kept abstract (essentially treating as an infinitesimal). Then represent the values $c - n*\epsilon$ by pairs $(c, -n)$ that are added component-wise and are compared lexicographically.

Assume an automaton is given that is a parallel composition of a number of components that do not share clocks. Now assume a finite "candidate" trace for that automaton is given, consisting of n states (numbered 1 . . . n and labeled St(1) . . . St(n)) where each component resides in a specific location, and n−1 transitions (numbered 1 . . . n−1 and labeled Tr(1) . . . Tr(n−1)) between these states where some components may make a transition, while others may remain in their previous location through an $\epsilon$-transition. In addition, a starting Tr(0) is used to model the constraint that in a timed automaton all clocks initially start at 0. The goal is to find out whether the candidate trace is feasible—that is, whether for some set of numbers $\{v_i | 0 \leq i \leq n\}$ an execution of the automaton transitioning from state i to state i+1 at time $v_i$ would satisfy all the location invariants and transition guards. If such sets $\{v_i\}$ exist, the algorithm must find one such set and if not, the algorithm must find a minimal infeasible fragment of the trace. There may be different ways of defining the notions of "fragment" and "minimal", the most straightforward of them being to simply find a minimal subset of components and a minimal consecutive subset of states [1 . . . n] that would still be infeasible.

Assume that initially all clocks start at 0. Note that for infeasible fragments that start at state 1, it is necessary to distinguish between the "anytime" fragments that do not rely on the initial clock value and therefore will be infeasible at any time during the automaton execution, and the "initial" fragments that are only infeasible when the clocks start at 0. To model the clocks starting at 0 and to help with distinguishing the two kinds of infeasible fragments, a virtual transition Tr(0) is introduced at time $v_0 = 0$ that resets all the clocks to 0. Note that this is the same $v_0$ which was mentioned previously.

Each location invariant and each transition guard is a conjunction of inequalities of the form $x \circ c$ where x is a clock, $\circ$ could be any of $<, \leq, >,$ or $\geq$ and $c \in \mathbb{Q}$. In addition, each transition has a set of clocks to be reset (after the guard is checked).

Timed automata traces must next be translated into labeled, weighted, directed graphs. Since clocks are not shared by the automaton components, it is not necessary to consider location invariants at every time step. Instead, it is sufficient to consider each location invariant only twice—right after the location is first transitioned into and right before the location is transitioned from (or at the very end of the trace, if the location is never transitioned from).

In order to perform the translation, a table mapping each clock to the transition number of the transition where the clock was last reset is maintained. This table is called a "clock map".

In order to perform the translation, the trace is followed and each conjunct of each of the invariants and guards in the trace is translated into a labeled difference inequality. The difference inequality is then translated into a weighted directed edge as discussed previously. Three kinds of labels are used, as will be explained below—P(•,•,•) (for "positive"), N(•,•,•.•) (for "negative"), and T(•) (for "time").

In order to translate a conjunct $x \circ c$ at time $t = v_i$ (which means that the conjunct can be either from location invariants of states i and i+1 or from transition guards of transition i), the clock x is looked up in the clock map. Suppose the clock x was last reset in transition j (it must be the case that $0 \leq j \leq i$). Two cases are considered:

1. $\circ$ is $<$ or $\leq$. In this case, the inequality $v_i - v_j \circ c$ is generated and labeled with N(comp, Tr(j), Tr(k), e), where;
   comp is the name of the component that the conjunct came from,
   Tr(j) is the label for transition j,
   e is the transition or state that the conjunct came from, and
   Tr(k) is the transition that made the inequality inevitable—that is, if the inequality is a transition guard, then Tr(k)=e and if the inequality is a location invariant that Tr(k) is the last non-$\epsilon$ transition of comp (the transition that caused the component to enter the location in question).

2. $\circ$ is $>$ or $\geq$. In this case the inequality $v_j - v_i \bar{\circ} - c$ is generated, where $\bar{\circ}$ is $<$ or $\leq$ respectively and the inequality is labeled with P(comp, Tr(j), e), where comp is the name of the component that the conjunct came from, Tr(j) is the label for transition j and e is the transition or state that the conjunct came from.

The translation algorithm proceeds as follows:
1. Initialize the clock map with the value 0 for each clock (this corresponds to the initial reset from the virtual transition).
2. Optionally translate all the location invariants of the state 1 at time $t=v_0$. This is optional as a well-formed automaton would always satisfy its invariants at startup.
3. For each i from 1 to n−1, do the following:
    a) Add an inequality $v_{i-1}-v_i \leq 0$ labeled T(i)—as transition times are non-decreasing.
    b) Set $t=v_i$.
    c) Translate location invariants for state i for all components that make a non-ϵ transition in transition number i.
    d) Translate transition invariants for the transition number i.
    e) Update the clock map to reflect all clocks reset in transition number i.
    f) Translate location invariants for state i+1 for all components that make a non-ϵ transition in transition number i.
4. Translate location invariants for state n at time $t=v_{n-1}$ for all components that make an ϵ-transition in transition number n−1. (The other components were already taken care of in the step 3c above.)

At the box 40, an infeasible fragment is determined from a negative cycle, and optimization is undertaken to derive the minimal infeasible fragment. In a preferred embodiment, the notion of a fragment is defined based on the "timeline" of states and transitions, as follows:

$$\text{Times}=\{Tr(0), St(1), Tr(1), \ldots, Tr(n-1), St(n)\} \quad (4)$$

Where Tr(0) is the virtual transition that resets all the clocks to the initial zero value. Currently the fragment is defined as a subset of the product set Components×Times, where Components is the set of all automaton components. Informally speaking, a subset of Components×Times roughly corresponds to a subset of the original trace's locations and transitions—with St(i) elements also implying a continuity requirement of not leaving the corresponding location for the duration of the step.

Note that it is possible to define more precise notions of a "fragment". In particular, in the timeline used above, St(i) conflates three different notions—entering into state i, duration of state i (the above "continuity requirement"), and exiting from state i.

On the Times timeline, the natural linear order is defined such that Tr(i−1)<St(i)<Tr(i).

A labeled negative cycle is translated into a subset of Components×Times by taking a union of translations of each label in the cycle as follows:
1. T(i) is translated to an empty set ∅.
2. P(c,b,e) is translated to a two-element set $\{<c,b>, <c,e>\}$. The first element of the set preserves the reset to 0 of the clock that gave rise to the inequality with this label. The second element of the set preserves the state (transition) whose invariant (guard) gave rise to the inequality with this label.
    Note that a different trace containing these two elements may have additional clock resets between b and e; however the P labels are only used for > and ≥ inequalities where an additional clock reset would only give rise to an even stronger inequality, so such additional resets cannot prevent a trace from remaining infeasible.
3. N(c,b,k,e) is translated to a set $\{<c,t>|b<t\leq e\}$. The $<c,e>$ element of the above set preserves the state (transition) whose invariant (guard) gave rise to the inequality with this label, while the $\{<c,t>|b<t\leq e\}$ remainder of the set preserves the lack of any clock reset after b (which could have weakened the inequality if it was allowed).
4. As an additional optimization for the item 3 above, if for some integers j>i≥0, the negative cycle contains a fragment with labels:

$$T(j), T(j-1), \ldots, T(i+1), N(c, Tr(i), Tr(k), e) \quad (5)$$

then instead of the set $\{<c,t>|Tr(i)<t\leq e\}$ required by item 3 above, a smaller set $\{<c,t>|Tr(j)<t\leq e\} \cup \{<c,e>\}$ can be used. The reason for this is that the above sequence of labels would correspond to a sequence of difference inequalities:

$$v_j \geq v_{j-1}, v_{j-1} \geq v_{j-2}, \ldots, v_{i+1} \geq v_i, v_i \circ v_x - \text{const} \quad (6)$$

where ○ is either > or ≥ and const is a numerical constant. In a negative cycle, the above sequence can be equivalently replaced with an inequality $v_j \circ v_x$−const. In other words, without sacrificing the infeasibility it is possible to replace the inequality $v_i \circ v_x$−const with a weaker inequality $v_j \circ v_x$−const which is equivalent to replacing the requirement "clock was not reset after Tr(i) with a weaker requirement "clock was not reset after Tr(j)—the requirement that can be ensured by the smaller set $\{<c,t>|Tr(j)<t\leq e\}$. One approach to implementing this optimization is to make a pass over the label sequence of a detected negative cycle, and whenever a sequence T(i+1), N(c,Tr(i),Tr(k),e) is found, replace it with a sequence N(c, min(Tr(i+1),pred e),Tr(k),e) (where pred Tr(x)=St(x) and pred St(x)=Tr(x−1)) and making sure to repeat this contraction to consume additional T(•) labels that may still be remaining.
5. Similarly, as another optimization for the item 3 above, if for some integers j>s≥0, the negative cycle contains a fragment:

$$N(c, Tr(i), Tr(k), St(j)), T(j), T(j-1), \ldots, T(s) \quad (7)$$

then instead of the set $\{<c,t>|Tr(i)<t\leq St(j)\}$ required by item 3 above, a smaller set $\{<c,t>|Tr(i)<t\leq Tr(\max(k,s-1))\}$ can be used. The reason for this optimization is that the label N(c,Tr(i),Tr(k),St(j)) must have been attached to an inequality that is a location invariant for a component that remained in this location for the period starting with the end of Tr(k) and up to and including St(j). The optimization simply corresponds to using the invariant at time step Tr(max(k,s−1)) instead of St(j). Similarly to previous optimization, one approach to implementing it is to make a pass over the label sequence of a detected negative cycle, and whenever a sequence N(c,Tr(i),Tr(k),St(j)),T(j) is found, replace it with N(c,Tr(i),Tr(k),Tr(max(k,j−1))) and then repeating if necessary. Note that if this "pass before translation" approach is implemented for both optimizations, this would allow applying both kinds of optimizations to the same N label, resulting in potentially smaller infeasible fragments.

At the box 42, infeasible fragments are encoded into the LTL specification. Consider a timed automaton trace of length n for a set of components Components. For each component c, the notation $\text{loc}_i(c)$ will be used to denote the location of the component c at time step i (1≤i≤n) and $\text{lab}_i(c)$ will denote the label of the component c's transition between time steps i and i+1 (1≤i<n).

In encoding an infeasible trace fragment into an LTL formula, the following assumptions are made:

A transition of a component c can be uniquely identified by a tuple $(c, l_1, e, l_2)$, where $l_1$ and $l_2$ are the transition's start and finish locations and e is the transition label.

When ending partially specified $<c, l_1, e, l_2>$ tuples, there is some way of encoding to LTL the predicates Start(c)=$l_1$, Label(c)=e, and Finish(c)=$l_2$. For example, a NuSMV model where each component is encoded as a process with variables loc for the current location and edge for the incoming transition label could be encoded as "Start(c)=$l_1$":="c.loc=$l_1$", "Label(c)=e":="X(c.edge=e)", and "Finish(c)=$l_2$":="X(c.loc=$l_2$)".

Now consider an infeasible fragment of a timed automaton trace, F ⊂ Components×Times. Let F(t):={c|<c,t>} denote the set of components that are a part of the infeasible fragment at time t (t∈ Times), where those components are known as "relevant at time t". Let Begin(F) be the largest integer such that for any <c,t>∈F, St(Begin(F))≤t and let End(F) be the smallest integer such that for any <c,t>∈F, St(End(F))≥t (these definitions assume F≠Ø which must be true as Ø cannot be infeasible).

The LTL encoding algorithm proceeds by recursively defining LTL formula $LTL_i$ for each i in the range max(Begin(F),1)≤i≤End(F) as follows:

1. First define the LTL formula for i=End(F) as follows:

$$LTL_i := \bigwedge_{c \in F(St(i))} (\text{Start}(c) = loc_{St(i)}(c)) \qquad (8)$$

2. Given $LTL_{i+1}$ is defined, $LTL_i$ is defined as follows:

$$LTL_i := \left( \bigwedge_{c \in F(St(i))} (\text{Start}(c) = loc_{St(i)}(c)) \right) \qquad (9)$$

$$\bigwedge \left( U \bigwedge_{c \in F(Tr(i))} \left( \begin{array}{l} \text{Start}(c) = loc_i(c) \wedge \\ \text{Label}(c) = lab_i(c) \wedge \\ \text{Finish}(c) = loc_{i+1}(c) \end{array} \right) \bigwedge X(LTL_{i+1}) \right)$$

Subject to the following optimizations:

a) If for all c∈F(Tr(i)), $lab_i(c)=\epsilon$, then the timeline can be "compressed", combining St(i) and St(i+1) into a single state (where each component that was relevant in either of the two original states is considered relevant in the combined state), and discarding Tr(i) from the timeline.

b) Removing redundant specifications:

If c∈F(St(i))∪F(Tr(i)) then assuming the model specification ensures the condition Label(c)=ϵ ⇒ (Start(c)=Finish(c)), the second occurrence of Start(c)=$loc_i$(c) can be omitted.

Similarly, if c∈F(Tr(i))∪F(St(i+1)), then $X(LTL_{i+1})$ would make the Finish(c)=$loc_{i+1}$(c) redundant and either it, or the corresponding Start(c)=$loc_{i+1}$(c) clause in $LTL_{i+1}$ can be dropped.

Similarly, if c∈F(Tr(i)) and $lab_i(c)=\epsilon$ (or any other label that would uniquely determine the finish location based on the start location), then Finish(c)=$loc_{i+1}$(c) can be omitted.

3. Finally, provided Begin(F)≥1, for i=Begin(F), $LTL_i$ can be defined as:

$$LTL_i := \left( \bigwedge_{c \in F(St(i))} (\text{Start}(c) = loc_{St(i)}(c)) \right) \qquad (10)$$

-continued $$\bigwedge \left( \bigwedge_{c \in F(Tr(i))} \left( \begin{array}{l} \text{Start}(c) = loc_i(c) \wedge \\ \text{Label}(c) = lab_i(c) \wedge \\ \text{Finish}(c) = loc_{i+1}(c) \end{array} \right) \right) \bigwedge X(LTL_{i+1})$$

Subject to the same optimizations as in the previous step. The final LTL specification is then defined as follows:

1. If Begin(F)≥1, then the final specification is $F(LTL_{Begin(F)})$.
2. Otherwise, Begin(F)=0 implies that the initial clock reset of Tr(0) is relevant, so the final specification is $LTL_1$.

Using the detailed methodology of the preceding pages, a negative cycle can be detected in a counterexample, an infeasible fragment identified in the negative cycle and optimized to a minimal length and breadth, and the LTL specification can be refined to exclude the minimal infeasible fragment. These techniques can be incorporated into computer-based simulations used for verifying performance properties of real-time control systems.

In benchmark experiments, the infeasibility identification method disclosed above was evaluated against a leading automata verification tool. An algorithm using the infeasibility identification approach was able to handle verification and counterexample simulations for problem sizes which caused the leading tool to run out of computer memory. In fact, the algorithm using the infeasibility identification approach was able to handle problem sizes about five times larger than the leading verification tool was able to handle. These results underscore the efficiency of the infeasibility identification method for timed automata. This method makes it possible to verify the performance of complex real-time systems used in automotive and other applications, thus enabling further improvements in performance, comfort, and safety.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for identifying a minimal infeasible fragment in a timed automaton trace, said method being implemented in a real-time control system verification algorithm encoded on a digital computer, said method comprising:
   providing a counterexample, where the counterexample is a path to an undesirable state identified by checking an abstract model of a timed automaton against a temporal logic specification;
   validating or invalidating the counterexample using negative cycle detection;
   identifying an infeasible fragment in the counterexample if a negative cycle is detected; and
   optimizing the infeasible fragment to produce the minimal infeasible fragment including combining and contracting inequalities to produce the minimal infeasible fragment which includes a minimal number of locations, transitions, and components.

2. The method of claim 1 wherein validating or invalidating the counterexample using negative cycle detection includes representing a system of inequalities as a directed graph with edges having distances, and identifying a set of contradictory inequalities within which the edge distances have a negative sum.

3. The method of claim 1 wherein identifying an infeasible fragment in the counterexample includes identifying, for one or more components, one or more transitions between locations which are not possible when considering clock restrictions.

4. The method of claim 1 wherein the temporal logic specification is a Linear Temporal Logic (LTL) specification.

5. A method for identifying a minimal infeasible fragment in a timed automaton trace, said method being implemented in a real-time control system verification algorithm encoded on a digital computer, said method comprising:
generating an abstract model of the timed automaton, where the abstract model recognizes only discrete state properties of a real-time system;
creating a Linear Temporal Logic (L TL) specification, where the L TL specification describes a performance property that is to be verified;
checking the abstract model against the L TL specification to determine if a path to an undesirable state can be found, where the path to the undesirable state is defined as a counterexample;
validating or invalidating the counterexample using negative cycle detection;
identifying an infeasible fragment in the counterexample if a negative cycle is detected;
optimizing the infeasible fragment to produce a minimal infeasible fragment, where the minimal infeasible fragment includes a minimal number of locations, transitions, and components; and
refining the L TL specification to exclude the minimal infeasible fragment.

6. The method of claim 5 wherein checking the abstract model against the LTL specification includes using an LTL model checker, outputting a Yes result if the abstract model satisfies the LTL specification, and identifying the counterexample if the abstract model does not satisfy the LTL specification.

7. The method of claim 5 wherein validating or invalidating the counterexample using negative cycle detection includes recognizing clock restrictions.

8. The method of claim 5 wherein negative cycle detection includes representing a system of inequalities as a directed graph with edges having distances, and identifying a set of contradictory inequalities within the system of inequalities.

9. The method of claim 8 wherein the set of contradictory inequalities are described by a directed graph within which the edge distances have a negative sum.

10. The method of claim 5 wherein identifying an infeasible fragment in the counterexample includes identifying, for one or more components, one or more transitions between locations which are not possible when considering clock restrictions.

11. The method of claim 5 wherein optimizing the infeasible fragment includes combining and contracting inequalities to produce a smaller set of inequalities which is still infeasible.

12. The method of claim 5 wherein the timed automaton is a model of a real-time control system used in a vehicle.

13. A method for identifying a minimal infeasible fragment in a timed automaton trace, said method being implemented in a real-time control system verification algorithm encoded on a digital computer, said method comprising:
modeling the real-time system as a timed automaton;
generating an abstract model of the timed automaton, where the abstract model recognizes only discrete state properties of the real-time system;
creating a Linear Temporal Logic (LTL) specification, where the LTL specification describes the performance property that is to be verified;
checking the abstract model against the L TL specification to determine if a path to an undesirable state can be found, where the path to the undesirable state is defined as a counterexample;
validating or invalidating the counterexample using negative cycle detection;
identifying an infeasible fragment in the counterexample if a negative cycle is detected;
optimizing the infeasible fragment to produce a minimal infeasible fragment, including combining and contracting inequalities to produce the minimal infeasible fragment which includes a minimal number of locations, transitions, and components; and
refining the LTL specification to exclude the minimal infeasible fragment.

14. The method of claim 13 wherein checking the abstract model against the LTL specification includes using an LTL model checker, outputting a Yes result if the abstract model satisfies the LTL specification, and identifying the counterexample if the abstract model does not satisfy the LTL specification.

15. The method of claim 13 wherein validating or invalidating the counterexample using negative cycle detection includes recognizing clock restrictions.

16. The method of claim 13 wherein negative cycle detection includes representing a system of inequalities as a directed graph with edges having distances, and identifying a set of contradictory inequalities within the system of inequalities.

17. The method of claim 13 wherein identifying an infeasible fragment in the counterexample includes identifying, for one or more components, one or more transitions between locations which are not possible when considering clock restrictions.

* * * * *